United States Patent
Li

(10) Patent No.: US 9,596,311 B2
(45) Date of Patent: Mar. 14, 2017

(54) DYNAMIC DATA COMPRESSION

(71) Applicant: INTERNATIONAL BUSINESS MACHINES CORPORATION, Armonk, NY (US)

(72) Inventor: David Q. Li, North Chelmsford, MA (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 14/527,798

(22) Filed: Oct. 30, 2014

(65) Prior Publication Data

US 2016/0127490 A1    May 5, 2016

(51) Int. Cl.
*G06F 15/16* (2006.01)
*H04L 29/08* (2006.01)
*H04L 12/811* (2013.01)
*H04L 12/26* (2006.01)
*H04L 12/801* (2013.01)

(52) U.S. Cl.
CPC ...... *H04L 67/2828* (2013.01); *H04L 43/0882* (2013.01); *H04L 47/38* (2013.01); *H04L 43/0817* (2013.01); *H04L 43/0864* (2013.01); *H04L 43/10* (2013.01); *H04L 47/29* (2013.01)

(58) Field of Classification Search
CPC ..... H04L 67/2828; H04L 47/10; H04L 47/25; H04L 47/38; H04L 69/04
See application file for complete search history.

(56) References Cited

U.S. PATENT DOCUMENTS

| | | | |
|---|---|---|---|
| 7,299,300 B2 | 11/2007 | Desai et al. | |
| 8,520,662 B2 | 8/2013 | Karaoguz et al. | |
| 2005/0188112 A1* | 8/2005 | Desai | H04L 47/10 709/247 |
| 2005/0234927 A1* | 10/2005 | Bande | G06F 17/30575 |
| 2006/0085541 A1* | 4/2006 | Cuomo | H04L 41/083 709/224 |
| 2011/0055360 A1* | 3/2011 | Jones | G06F 15/16 709/219 |

\* cited by examiner

*Primary Examiner* — Tauqir Hussain
*Assistant Examiner* — Austin Moreau
(74) *Attorney, Agent, or Firm* — John W. Hayes; William H. Hartwell

(57) ABSTRACT

A method for dynamic data compression includes receiving, at a first computer system, a request for data from a second computer system. A distance factor is determined, based, at least in part, on distance separating the first computer system and the second computer system. A processor loading factor is determined, based, at least in part, on one or more processor utilization percentages of the first computer system, and a network bandwidth factor is determined, based, at least in part, on bandwidth utilization of data transport fabric interconnecting the first computer system and the second computer system. A data compression selection index is calculated, based, at least in part, on the distance factor, the processor loading factor, and the network bandwidth factor. The requested data is compressed, when indicated by the calculated data compression selection index, and transmitted from the first computer system to the second computer system.

15 Claims, 3 Drawing Sheets

DYNAMIC DATA COMPRESSION

FIELD OF THE INVENTION

The present invention relates generally to data transport, and more particularly to dynamic data compression.

BACKGROUND OF THE INVENTION

Digital data transmission is the physical transfer of a digital bit stream over a point-to-point or point-to-multipoint communication channel. The communication channels may include copper wires, optical fiber, wireless communication, storage media, and computer buses. Examples of environments which typically see high levels of data transmissions are data warehouse environments and synchronous mirroring in database replication environments. A data warehouse is a system or combination of systems used to integrate current and historical data from one or more sources to perform data analysis and create reports, such as quarterly and annual comparisons. Typical workloads in data warehouse environments are intensive for network hardware, with operations such as large data loads and index builds, creation of materialized views, and queries over large volumes of data.

Database mirroring is used to increase the availability of databases in the event of an outage or disaster. With automatic failover, a detected outage quickly brings up a standby copy of the database with little to no data loss. Synchronous mirroring ensures all data is written to both databases, however, the cost is increased network traffic and transaction latency. With such large amounts of data being transmitted, bandwidth is important in both data warehouse and database replication environments. Some methods used to improve throughput or guarantee desired levels of bandwidth are bandwidth throttling and quality of service (QoS).

Bandwidth throttling is the intentional slowing of certain network data to regulate network traffic and minimize bandwidth congestion. Throttling can be used to limit a user's upload or download rates on programs such as video streaming. In the field of computer networking, QoS is the ability to provide different priority to different applications, users, or data flows, or to guarantee a certain level of performance to a data flow. For example, a pre-defined bit rate, delay, jitter, packet dropping probability and/or bit error rate may be guaranteed.

SUMMARY

Embodiments of the present invention disclose a method, computer program product, and system for dynamic data compression. The method includes receiving, at a first computer system, a request for data from a second computer system. A distance factor is determined, based, at least in part, on distance separating the first computer system and the second computer system. A processor loading factor is determined, based, at least in part, on one or more processor utilization percentages of the first computer system, and a network bandwidth factor is determined, based, at least in part, on bandwidth utilization of data transport fabric interconnecting the first computer system and the second computer system. A data compression selection index is calculated, based, at least in part, on the distance factor, the processor loading factor, and the network bandwidth factor. The requested data is compressed, when indicated by the calculated data compression selection index, and transmitted from the first computer system to the second computer system.

DETAILED DESCRIPTION

Embodiments in accordance with the present invention recognize that as cloud computing and big data become more and more prevalent in enterprise business environments, data volume transferred between clients and server applications over Wide Area Networks (WAN) has increased dramatically. Data compression is an effective way to reduce data volume transferred over a network. However, almost all compression algorithms will increase CPU utilization of the server, because of the overhead associated with compressing large blocks of data. The CPU overhead for a fixed compression algorithm may result in poor server performance at peak load, and offset the benefit of data compression.

Embodiments in accordance with the present invention provide ways to dynamically determine a data compression selection index for requested data before it is transmitted by server applications. In one embodiment, the compression selection index is dynamically determined by using three factors: a distance factor related to Round Trip Time (RTT) between a data source and destination, a processor loading factor related to Central Processing Unit (CPU) utilization factor at the source, and a network bandwidth factor related to available bandwidth over data transport fabric connecting the data source and destination. The RTT is the length of time it takes for a data packet to be sent from the data source to the destination (from a server to a client, for example), plus the length of time it takes for an acknowledgement to be received. Processor loading factor refers to usage of processing resources at the data source (the server, for example), or the amount of work handled by the CPU compared to the CPU's maximum processing capability. Network bandwidth factor is based upon a measurement of the present bandwidth utilization compared to total available bandwidth over the data transport fabric. The data compression selection index is determined dynamically when a client requests data to be transferred from a server.

Based on the calculated data compression selection index, the dynamic compression application determines whether to compress the data, and how deep the compression should be. This aids in preventing the CPU overhead of data compression from impacting server performance, and also performs compression in a way that will favor clients that are farther away from the server over clients that are close to the server.

Figure 1:
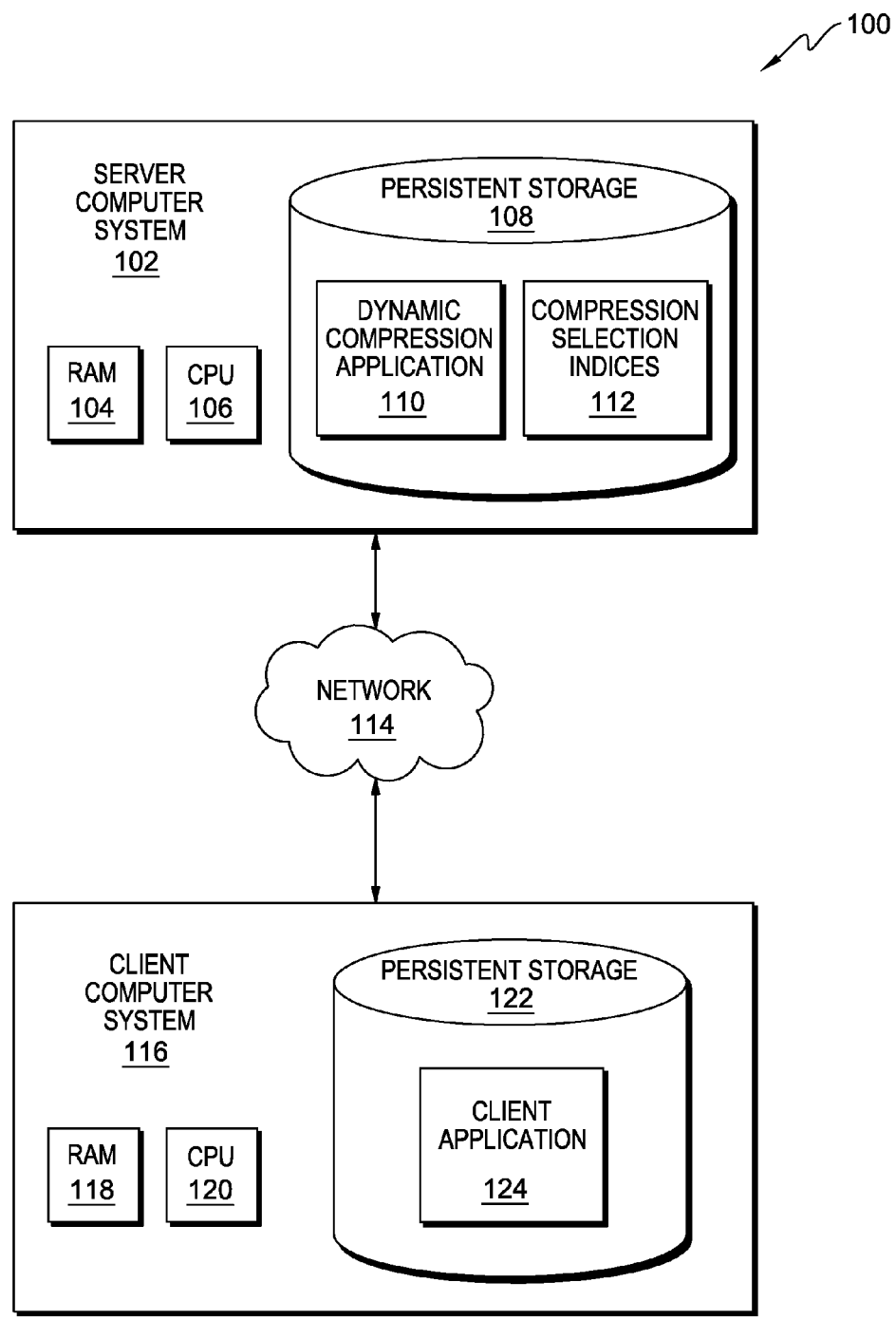
FIG. 1 is a functional block diagram illustrating a dynamic data compression environment, in an embodiment in accordance with the present invention.

Embodiments in accordance with the present invention will now be described in detail with reference to the Figures. FIG. 1 is a functional block diagram illustrating a dynamic data compression environment 100, in an embodiment in accordance with the present invention. A Server Computer System 102 includes RAM 104, a central processing unit 106, and persistent storage 108. Persistent storage 108 may, for example, be a hard disk drive. Dynamic compression application 110 and compression selection indices 112 are stored in persistent storage 108, which also includes operating system software, as well as, software that enables Server Computer System 102 to communicate with client computer system 116 over a data connection on network 114.

In FIG. 1, network 114 is shown as the interconnecting fabric between server computer system 102 and client computer system 116. In practice, the connection may be any viable data transport network, such as, for example, a LAN or WAN. Network 114 can be for example, a local area network (LAN), a wide area network (WAN) such as the Internet, or a combination of the two, and include wired, wireless, or fiber optic connections. In general, network 114 can be any combination of connections and protocols that will support communications between server computer system 102 and client computer system 116.

Client computer system 116 also contains RAM 118, a central processing unit 120, and persistent storage 122 such as a hard disk drive. Client application 124, that is stored in persistent storage 122, includes operating system software, as well as, software that enables client computer system 116 to communicate with server computer system 102 over a data connection. Client computer system 116 may be a laptop computer, tablet computer, netbook computer, personal computer (PC), a desktop computer, a personal digital assistant (PDA), a smart phone, or any programmable electronic device capable of communicating with server computer system 102 via Network 114. In certain embodiments, server computer 102 represents a computer system utilizing clustered computers and components that act as a single pool of seamless resources when accessed through network 114, as is common in data centers and with cloud computing applications.

Server computer 102 includes dynamic compression application 110. Dynamic compression application 110 receives data requests from client computer system 116 over network 114. Dynamic compression application 110 dynamically determines the data compression selection index for the data, based on the distance factor, the processor loading factor, and the network bandwidth factor.

Figure 2:
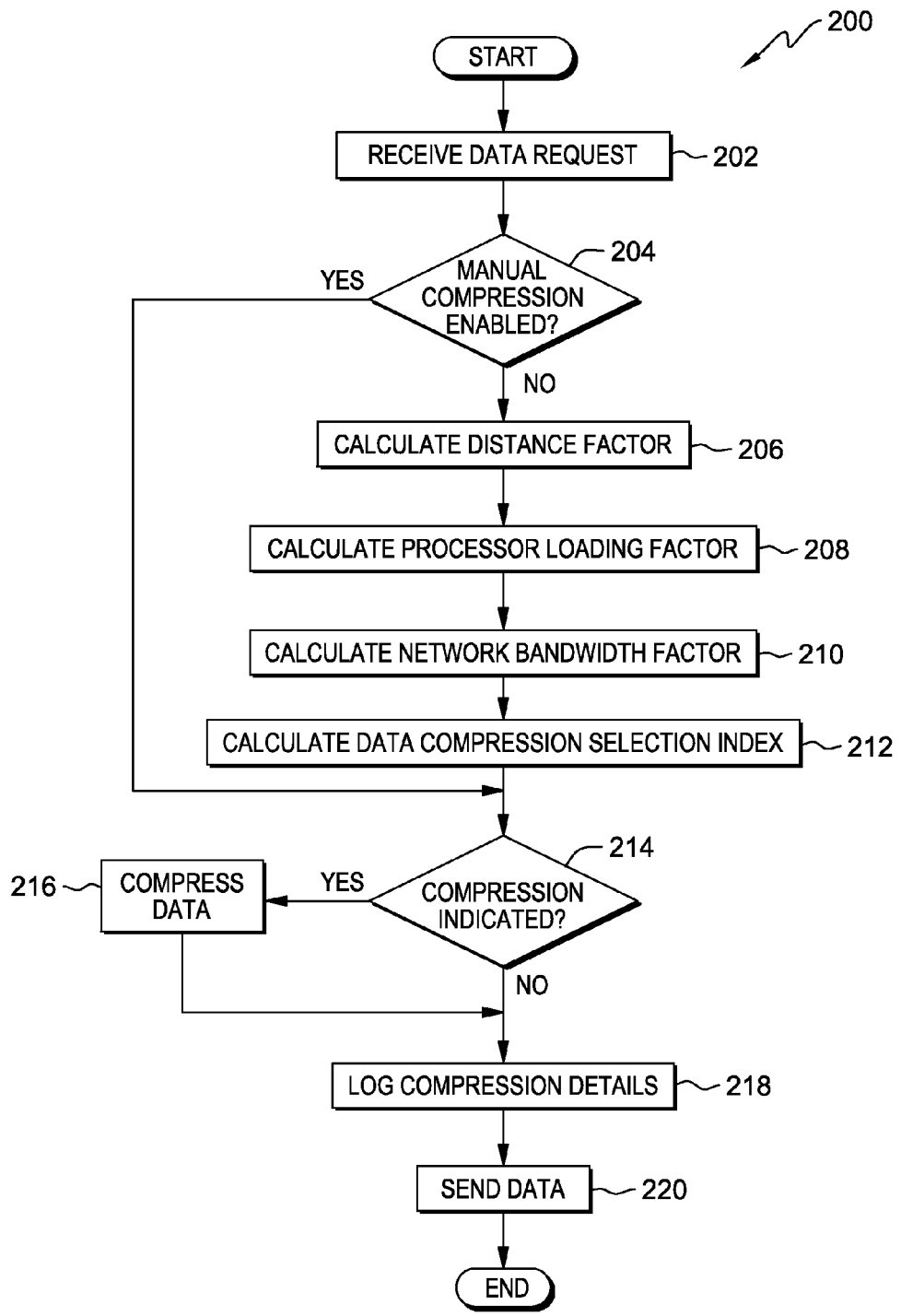
FIG. 2 is a flowchart illustrating operational steps for dynamically determining data compression selection indices within the dynamic data compression environment of FIG. 1, in an embodiment in accordance with the present invention.

FIG. 2 is a flowchart, generally depicted by the numeral 200, illustrating operational steps for dynamically determining data compression selection indices within the dynamic data compression environment of FIG. 1, in an embodiment in accordance with the present invention. A request for data is received by dynamic compression application 110 at server computer system 102 in step 202. In step 204, dynamic compression application 110 checks to see whether manual data compression is enabled for all client requests. When manual data compression is enabled ("yes" branch, step 204), all client requests receive the same level of compression for a fixed period of time, bypassing steps 206 through 212. If manual data compression is not enabled, ("no" branch, step 204), dynamic compression application 110 moves on to the next step. In the next step 206, dynamic compression application 110 calculates the distance factor by determining the distance or round trip time (RTT) to client computer system 116. Empirical data suggest that it may be beneficial, in some instances, to cap the round trip time value. For certain types of operating environments, such as, for example, but not limited to, private cloud environments, round trip time may be capped at 250 milliseconds. The round trip time may be capped at 400 milliseconds for a public cloud environment, and other cap values may be suitable for certain other types of network configurations. Dynamic compression application 110 determines the client distance by using the ping networking utility to send an Internet Control Message Protocol (ICMP) Echo Request message to client computer system 116. Client computer system 116 replies to the request with an ICMP response which dynamic compression application 110 then uses to measure the RTT in milliseconds. In another embodiment, the client distance factor can be determined using the Transmission Control Protocol (TCP) RTT from client computer system 116 to Server Computer System 102.

Once determined, the client distance is used to determine the distance factor based on a conditional check between the client distance and maximum round trip time. When the client distance is greater than or equal to the maximum RTT, the distance factor is set to 1. If the client distance is less than the maximum RTT, the distance factor is determined using the following:

$$cdf = \left(\frac{cd}{mrt}\right) \qquad (1)$$

where cdf indicates the distance factor, cd indicates the client distance, and mrt indicates the maximum RTT. If the client distance is less than the maximum RTT in equation (1) above, the client distance factor is determined by finding the quotient of the client distance and maximum RTT.

In step 208, dynamic compression application 110 determines the processor loading factor by using the current CPU utilization percentage seen by the server. In one embodiment, the CPU utilization percentage can be determined on systems using Windows® operating systems by using the Task Manager, System Monitor, or with "wmic" from a command line. In another embodiment using UNIX-like systems, a command such as "top" can be used to determine the CPU utilization. In other embodiments, the CPU utilization percentage may be obtained using periodic sampling and using the average value. In other embodiments, the CPU utilization may be obtained using a rolling average with a larger number of samples. Server Computer System 102 processor loading factor is lower when CPU utilization is high, so that less compression will be attempted when the server is busy. The processor loading factor is determined according to:

$$utf = (1 - ut\ \%) \qquad (2)$$

where utf indicates the processor loading factor, and ut % indicates the CPU utilization percentage at the server. Server Computer System 102 CPU loading factor is determined, using equation (2) above, by finding the difference of 1 and the CPU utilization percentage, expressed as a decimal, at the server. For example, for a CPU utilization percentage of 20%, the CPU utilization percentage is expressed as a decimal fraction (0.20), and subtracted from 1, to yield a processor loading factor of 0.80.

In the next step 210, dynamic compression application 110 determines the bandwidth factor by using the current network utilization percentage seen by the server. In one embodiment, the network utilization percentage can be found on systems using Windows® operating systems with the Task Manager, System Monitor, or with "netstat" from a command line. In another embodiment using UNIX-like systems, a command such as "ifstat" can be used to determine the network utilization. Bandwidth factor is higher when network utilization is high, so that less data will be transferred over the network to avoid network and I/O bottlenecking. The bandwidth factor is determined according to:

$$ntf = nt\ \%  \quad (3)$$

where ntf indicates the bandwidth factor, and nt % indicates the network utilization percentage, expressed as a decimal fraction. Server Computer System 102 bandwidth factor is determined, using equation (3) above, by finding the network utilization percentage expressed as a decimal fraction. For example, if the network utilization percentage is determined to be 50%, the network utilization percentage is expressed as a decimal fraction (0.50), and the network bandwidth factor is determined to be 0.50.

Dynamic compression application 110 then calculates the data compression selection index as depicted in step 212 using the average of the already determined distance factor, processor loading factor, and network bandwidth factor according to:

$$dci = \left(\frac{cdf + utf + ntf}{3}\right) \quad (4)$$

where dci indicates the data compression selection index, cdf indicates the distance factor, utf indicates the processor loading factor, and ntf indicates the network bandwidth factor. The data compression selection index is determined, using equation (4) above, by calculating the average of the distance factor, processor loading factor, and network bandwidth factor. In step 214, based on the data compression selection index calculated dynamically at the time of client computer system 116 requests, dynamic compression application 110 decides not to compress if the ratio is below a threshold, such as 0.2. If the ratio is over the predetermined threshold ("yes" branch, step 214), dynamic compression application 110 chooses a compression algorithm based on the data compression selection index just calculated (step 216). If data compression is not indicated by the data compression selection index ("no" branch, step 214), dynamic compression application 110 continues on to the next step.

When manual data compression is enabled in step 216, the data compression selection index is chosen from data compression selection indices 112 list stored in persistent storage 108 and applied to all client data requests. In one embodiment in accordance with the present invention, manual data compression selection indices may be defined by an administrator or may be chosen by dynamic compression application 110 from previously logged dynamic compression ratios. In other embodiments, dynamic compression application 110 can increase or decrease the data compression selection index based on the average of dynamically calculated data compression selection indices over a fixed time period.

Data compression falls into two classes, lossless, and lossy. Lossless data compression is a class of data compression algorithms that allows the original data to be perfectly reconstructed from the compressed data. Lossy data compression is a class of data compression algorithms that use inexact approximations, or partial data discarding, for representing the encoded content. In one embodiment in accordance with the present invention, lossless data compression algorithms may be used when compression is required. In another embodiment in accordance with the present invention, when the requested data may be multimedia data such as audio, video, and images, lossy data compression algorithms may be used when compression is required. In other embodiments, compression algorithms used by utilities such as PKZIP, gzip, 7-zip, bzip2, and winzip can be used to compress data. This includes DEFLATE, LZ77, and Huffman coding. In some embodiments in accordance with the present invention, once the decision to compress has been made, selection of a particular compression algorithm may be effected, at least in part, through consideration of the compression ratio of the particular algorithm, as well as, the values of one or more of the distance factor, processor loading factor, and network bandwidth factor. The calculated value of the data compression selection index itself may also be taken into account when selecting a particular compression algorithm.

The data compression selection index details are then logged for future reference by administrators or server management tasks as depicted in step 218. In step 220, the data is then transmitted to client computer system 116 over network 114.

Figure 3:
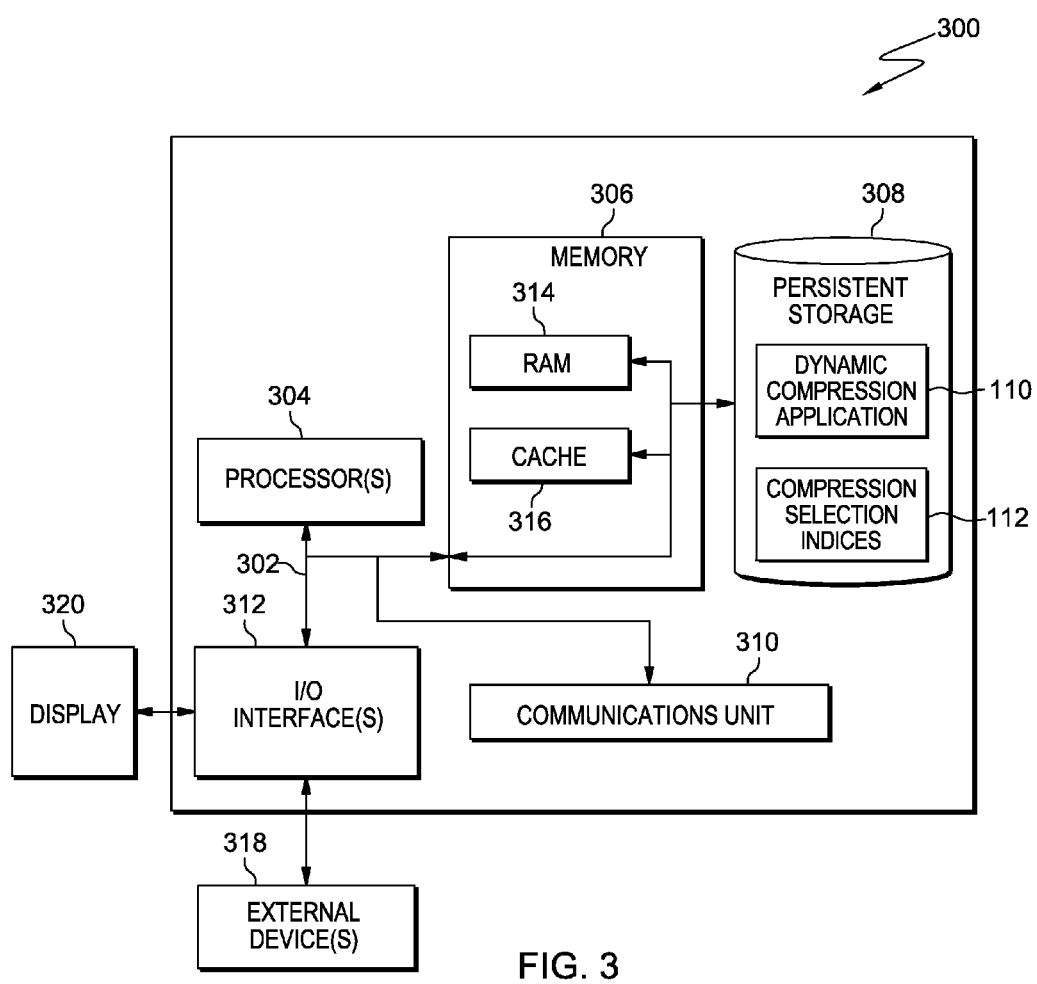
FIG. 3 is a functional block diagram of a computer system in an embodiment in accordance with the present invention.

FIG. 3 depicts a block diagram of components of a computer system 300 in an embodiment in accordance with the present invention. Computer system 300 is representative of server computer system 102, hosting dynamic compression application 110 and compression selection indices 112, along with data structures and/or other resources in an illustrative embodiment in accordance with the present invention. It should be appreciated that FIG. 3 provides only an illustration of one implementation and does not imply any limitations with regard to the environments in which different embodiments may be implemented. Many modifications to the depicted environment may be made.

Server Computer System 102 includes communications fabric 302, which provides communications between computer processor(s) 304, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses.

Memory 306 and persistent storage 308 are computer readable tangible storage devices. A storage device is any piece of hardware that is capable of storing information, such as data, program code in functional form, and/or other suitable information on a temporary basis and/or permanent basis. In this embodiment, memory 306 includes random access memory (RAM) 314 and cache memory 316. In general, memory 306 can include any suitable volatile or non-volatile computer readable storage media.

Dynamic compression application 110 is stored in persistent storage 308 for execution by one or more of the respective computer processors 304 via one or more memories of memory 306. In this embodiment, persistent storage 308 includes a magnetic hard disk drive. Alternatively, or in addition to a magnetic hard disk drive, persistent storage 308 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 308 may also be removable. For example, a removable hard drive may be used for persistent storage 308. Other examples include optical and magnetic disks, thumb drives, and smart cards that are inserted into a drive for transfer onto another computer readable storage medium that is also part of persistent storage 308.

Communications unit 310, in these examples, provides for communications with other data processing systems or devices, including resources of network 114 and client computer system 116. In these examples, communications unit 310 includes one or more network interface cards. Communications unit 310 may provide communications through the use of either or both physical and wireless communications links. Dynamic compression application 110 may be downloaded to persistent storage 308 through communications unit 310.

I/O interface(s) 312 allows for input and output of data with other devices that may be connected to Server Computer System 102. For example, I/O interface 312 may provide a connection to external devices 318 such as a keyboard, keypad, a touch screen, and/or some other suitable input device. External devices 318 can also include portable computer readable storage media such as, for example, thumb drives, portable optical or magnetic disks, and memory cards. Software and data used to practice embodiments of the present invention, e.g., dynamic compression application 110 can be stored on such portable computer readable storage media and can be loaded onto persistent storage 308 via I/O interface(s) 312. I/O interface(s) 312 also connect to a display 320.

Display 320 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for dynamic data compression, the method comprising:
    receiving, by one or more processors of a first computer system, a request for data from a second computer system;
    determining, by one or more processors, a distance factor based, at least in part, on distance separating the first computer system and the second computer system;
    determining, by one or more processors, a processor loading factor based, at least in part, on one or more processor utilization percentages of the first computer system;
    determining, by one or more processors, a network bandwidth factor based, at least in part, on bandwidth utilization of data transport fabric interconnecting the first computer system and the second computer system;
    calculating, by one or more processors, a data compression selection index based, at least in part, on the distance factor, the processor loading factor, and the network bandwidth factor, wherein the data compression selection index is calculated according to the following, where dci indicates the data compression selection index, cdf indicates the distance factor, utf indicates the processor loading factor, and ntf indicates the network bandwidth factor:

$$dci = \left(\frac{cdf + utf + ntf}{3}\right)$$

compressing, by one or more processors, the requested data, when indicated by the calculated data compression selection index;
    transmitting, by one or more processors, the requested data from the first computer system to the second computer system;
    dynamically calculating, by one or more processors, a set of data compression selection indices for the first computer system as a whole;
    applying, by one or more processors, the set of dynamically calculated data compression selection indices for an indicated compression level to all client requests; and
    automatically adjusting, by one or more processors, the set of dynamically calculated data compression selection indices and indicated compression levels based on the average of dynamically calculated compression selection indices over a fixed time period.

2. The method of claim 1, wherein determining, by one or more processors, a distance factor based, at least in part, on distance separating the first computer system and the second computer system further comprises:
    defining, by one or more processors, a maximum RTT (round trip time) between the first computer system and the second computer system;
    determining, by one or more processors, the client computer round trip time using an echo or ping request or TCP (transmission control protocol) round trip time; and
    calculating, by one or more processors, the distance factor using the maximum round trip time and client computer round trip time according to:

$$cdf = \left(\frac{cd}{mrt}\right)$$

where cdf indicates the distance factor, cd indicates the client distance, and mrt indicates the maximum RTT.

3. The method of claim 1, wherein determining, by one or more processors, a processor loading factor based, at least in part, on one or more processor utilization percentages of the first computer system further comprises:
    determining, by one or more processors, the server CPU (central processing unit) utilization percentage; and
    calculating, by one or more processors, the processor loading factor using the server CPU utilization percentage according to:

$$utf = (1 - ut\%)$$

where utf indicates the processor loading factor, and ut % indicates the server CPU utilization percentage expressed as a decimal fraction.

4. The method of claim 1, wherein determining, by one or more processors at a server, the network bandwidth factor further comprises:
    determining, by one or more processors, the server network utilization percentage; and
    calculating, by one or more processors, the network bandwidth factor using the server network utilization percentage according to:

$$ntf = nt\%$$

where ntf indicates the network bandwidth factor, and nt % indicates the network utilization percentage expressed as a decimal fraction.

5. The method of claim 1, wherein compressing, by one or more processors at a server, the requested data, when indicated by the calculated data compression selection index further comprises:

compressing, by one or more processors, the requested data using compression algorithms based on the calculated compression selection index.

6. A computer program product for dynamic data compression, the computer program product comprising:
one or more computer readable storage media and program instructions stored on the one or more computer readable storage media, the program instructions comprising:
program instructions to receive, by one or more processors of a first computer system, a request for data from a second computer system;
program instructions to determine, by one or more processors, a distance factor based, at least in part, on distance separating the first computer system and the second computer system;
program instructions to determine, by one or more processors, a processor loading factor based, at least in part, on one or more processor utilization percentages of the first computer system;
program instructions to determine, by one or more processors, a network bandwidth factor based, at least in part, on bandwidth utilization of data transport fabric interconnecting the first computer system and the second computer system;
program instructions to calculate, by one or more processors, a data compression selection index based, at least in part, on the distance factor, the processor loading factor, and the network bandwidth factor, wherein the data compression selection index is calculated according to the following, where dci indicates the data compression selection index, cdf indicates the distance factor, utf indicates the processor loading factor, and ntf indicates the network bandwidth factor:

$$dci = \left(\frac{cdf + utf + ntf}{3}\right)$$

program instructions to compress, by one or more processors, the requested data, when indicated by the calculated data compression selection index;
program instructions to transmit, by one or more processors, the requested data from the first computer system to the second computer system;
program instructions to dynamically calculate, by one or more processors, a set of data compression selection indices for the first computer system as a whole;
program instructions to apply, by one or more processors, the set of dynamically calculated data compression selection indices for an indicated compression level to all client requests; and
program instructions to automatically adjust, by one or more processors, the set of dynamically calculated data compression selection indices and indicated compression levels based on the average of dynamically calculated compression selection indices over a fixed time period.

7. The computer program product of claim 6, wherein program instructions to determine, by one or more processors, a distance factor based, at least in part, on distance separating the first computer system and the second computer system further comprises:
program instructions to define a maximum RTT (round trip time) between the first computer system and the second computer system;
program instructions to determine the client computer round trip time using an echo or ping request or TCP (transmission control protocol) round trip time; and
program instructions to calculate the distance factor using the maximum round trip time and client computer round trip time according to:

$$cdf = \left(\frac{cd}{mrt}\right)$$

where cdf indicates the distance factor, cd indicates the client distance, and mrt indicates the maximum RTT.

8. The computer program product of claim 6, wherein program instructions to determine, by one or more processors, a processor loading factor based, at least in part, on one or more processor utilization percentages of the first computer system further comprises:
program instructions to determine the server CPU (central processing unit) utilization percentage; and
program instructions to calculate the processor loading factor using the server CPU utilization percentage according to:

$$utf = (1 - ut\ \%)$$

where utf indicates the processor loading factor, and ut % indicates the server CPU utilization percentage expressed as a decimal fraction.

9. The computer program product of claim 6, wherein program instructions to determine, by one or more processors, the network bandwidth factor further comprises:
program instructions to determine the server network utilization percentage; and
program instructions to calculate the network bandwidth factor using the server network utilization percentage according to:

$$ntf = nt\ \%$$

where ntf indicates the network bandwidth factor, and nt % indicates the network utilization percentage expressed as a decimal fraction.

10. The computer program product of claim 6, wherein program instructions to compress, by one or more processors at a server, the requested data, when indicated by the calculated data compression selection index further comprises:
program instructions to compress the requested data using compression algorithms based on the calculated compression selection index.

11. A computer system for dynamic data compression, the computer system comprising:
one or more computer processors;
one or more computer readable storage media;
program instructions stored on the computer readable storage media for execution by at least one of the one or more processors, the program instructions comprising:
program instructions to receive, by one or more processors of a first computer system, a request for data from a second computer system;
program instructions to determine, by one or more processors, a distance factor based, at least in part, on distance separating the first computer system and the second computer system;
program instructions to determine, by one or more processors, a processor loading factor based, at least in part, on one or more processor utilization percentages of the first computer system;

program instructions to determine, by one or more processors, a network bandwidth factor based, at least in part, on bandwidth utilization of data transport fabric interconnecting the first computer system and the second computer system;

program instructions to calculate, by one or more processors, a data compression selection index based, at least in part, on the distance factor, the processor loading factor, and the network bandwidth factor, wherein the data compression selection index is calculated according to the following, where dci indicates the data compression selection index, cdf indicates the distance factor, utf indicates the processor loading factor, and ntf indicates the network bandwidth factor:

$$dci = \left(\frac{cdf + utf + ntf}{3}\right)$$

program instructions to compress, by one or more processors, the requested data, when indicated by the calculated data compression selection index;

program instructions to transmit the requested data from the first computer system to the second computer system;

program instructions to dynamically calculate, by one or more processors, a set of data compression selection indices for the first computer system as a whole;

program instructions to apply, by one or more processors, the set of dynamically calculated data compression selection indices for an indicated compression level to all client requests; and program instructions to automatically adjust, by one or more processors, the set of dynamically calculated data compression selection indices and indicated compression levels based on the average of dynamically calculated compression selection indices over a fixed time period.

12. The computer system of claim 11, wherein program instructions to determine, by one or more processors, a distance factor based, at least in part, on distance separating the first computer system and the second computer system further comprises:

program instructions to define a maximum RTT (round trip time) between the first computer system and the second computer system;

program instructions to determine the client computer round trip time using an echo or ping request or TCP (transmission control protocol) round trip time; and program instructions to calculate the distance factor using the maximum round trip time and client computer round trip time according to:

$$cdf = \left(\frac{cd}{mrt}\right)$$

where cdf indicates the distance factor, cd indicates the client distance, and mrt indicates the maximum RTT.

13. The computer system of claim 11, wherein program instructions to determine, by one or more processors, a processor loading factor based, at least in part, on one or more processor utilization percentages of the first computer system further comprises:

program instructions to determine the server CPU (central processing unit) utilization percentage; and program instructions to calculate the processor loading factor using the server CPU utilization percentage according to:

$$utf = (1 - ut\%)$$

where utf indicates the processor loading factor, and ut % indicates the server CPU utilization percentage expressed as a decimal fraction.

14. The computer system of claim 11, wherein program instructions to determine, by one or more processors, the network bandwidth factor based, at least in part, on bandwidth utilization of data transport fabric interconnecting the first computer system and the second computer system further comprises:

program instructions to determine the server network utilization percentage; and program instructions to calculate the network bandwidth factor using the server network utilization percentage according to:

$$ntf = nt\%$$

where ntf indicates the network bandwidth factor, and nt % indicates the network utilization percentage expressed as a decimal fraction.

15. The computer system of claim 11, wherein program instructions to compress, by one or more processors at a server, the requested data, when indicated by the calculated data compression selection index further comprises:

program instructions to compress the requested data using compression algorithms based on the calculated compression selection index.

* * * * *